(12) United States Patent
Katayama et al.

(10) Patent No.: US 6,524,389 B1
(45) Date of Patent: Feb. 25, 2003

(54) SUBSTRATE PROCESSING APPARATUS

(75) Inventors: Kyoshige Katayama, Ueki-Machi (JP); Yuta Yoshimura, Kumamoto (JP); Takeshi Tamura, Koshi-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/576,074

(22) Filed: May 22, 2000

(30) Foreign Application Priority Data

May 24, 1999 (JP) ............................................. 11-143149

(51) Int. Cl.$^7$ .............................................. B05C 11/00
(52) U.S. Cl. ............................ 118/712; 118/66; 118/69; 118/64; 118/59
(58) Field of Search .............................. 118/59, 66, 69, 118/58, 712, 724, 725, 50, 64; 29/25.01; 219/444.1, 460.1, 465.1, 468.1; 432/259; 392/467, 309, 418

(56) References Cited

U.S. PATENT DOCUMENTS

| | | | | |
|---|---|---|---|---|
| 5,735,961 A | * | 4/1998 | Shimada ...................... | 118/715 |
| 5,792,304 A | * | 8/1998 | Tamura et al. ............... | 118/724 |
| 5,817,156 A | * | 10/1998 | Tateyama et al. ............ | 118/725 |
| 5,817,178 A | * | 10/1998 | Mita et al. .................... | 118/58 |
| 6,096,135 A | * | 8/2000 | Guo et al. .................... | 118/715 |
| 6,097,005 A | * | 8/2000 | Akimoto ...................... | 118/724 |
| 6,113,702 A | * | 9/2000 | Halpin et al. ................ | 118/500 |
| 6,191,394 B1 | * | 2/2001 | Shirakawa et al. .......... | 118/724 |
| 6,197,385 B1 | * | 3/2001 | Takeshita et al. ............ | 118/320 |
| 6,261,365 B1 | * | 7/2001 | Matsuyama et al. ......... | 118/50 |
| 6,291,800 B1 | * | 9/2001 | Shirakawa et al. .......... | 118/724 |

FOREIGN PATENT DOCUMENTS

| | | |
|---|---|---|
| JP | 02153521 A | 6/1990 |
| JP | 11274148 A | 10/1999 |

* cited by examiner

Primary Examiner—Richard Crispino
Assistant Examiner—George R Koch, III
(74) Attorney, Agent, or Firm—Rader, Fishman & Grauer PLLC

(57) ABSTRACT

In a processing chamber for performing heat processing for a substrate, gas for purge, for example, $N_2$ is supplied nearly parallel to the substrate placed on a hot plate with a gap forming member between them and toward both the front and rear faces of the substrate. Thus, an atmosphere around the substrate can be exchanged for the gas for purge efficiently, and moreover the atmosphere around the substrate can be exchanged uniformly. Accordingly, heat processing in a low oxygen atmosphere can be performed in a short time, and moreover the total time required for substrate processing can be shortened. Besides, heat processing in the low oxygen atmosphere can be performed uniformly.

6 Claims, 19 Drawing Sheets

SUBSTRATE PROCESSING APPARATUS

BACKGROUND OF THE INVENTION

1. Field of the Invention

The present invention relates to a substrate processing apparatus for performing heat processing and cooling processing for a substrate such as a semiconductor wafer or the like.

2. Description of the Related Art

In processes of semiconductor device fabrication, a layer insulating film is formed, for example, by an SOD (Spin on Dielectric) system. In this SOD system, a wafer is coated with a coating film by spinning the wafer, and chemical processing, heat processing, or the like is performed for the wafer to thereby form a layer insulating film thereon.

When a layer insulating film is formed by a sol-gel process, for example, first an insulating film material, for example, a solution in which colloids of TEOS (tetraethoxysilane) are dispersed in an organic solvent is supplied onto a semiconductor wafer (hereinafter referred to as "wafer"). Thereafter, the wafer to which the solution is supplied is subjected to gelling processing, and then exchange of solvents is performed. Subsequently, the wafer on which solvents are exchanged undergoes heat processing.

In a series of these processes, a variety of heat processing and cooling processing are performed. Commonly, the above heat processing and cooling processing are performed by placing a wafer on a hot plate or a chill plate (each referred to as a plate hereinafter) for subjecting the wafer to heat processing or cooling processing. However, on the grounds that the wafer is adversely affected by static electricity if the wafer is placed directly on the plate, a gap forming member is placed on the plate, and heat processing or cooling processing is performed for the wafer while a gap is formed between the wafer and the plate.

Incidentally, when the wafer which has undergone solvent exchange is subjected to heat processing at a high temperature in the above heat processing and cooling processing, processing is performed in a low-oxygen atmosphere in terms of the prevention of oxidation. Such a low-oxygen atmosphere is formed, for example, by exchanging an atmosphere inside a processing chamber for $N_2$ gas after the wafer is transferred into the processing chamber.

There is a disadvantage that if the formation of a desired low-oxygen atmosphere by exchanging an atmosphere inside the processing chamber for $N_2$ requires considerable time, the time required for heat processing in a low oxygen atmosphere is virtually lengthened, thereby exerting a bad influence on the total processing time to form an insulating film. Hence, it is desired to exchange the atmosphere inside the processing chamber for $N_2$ gas efficiently.

SUMMARY OF THE INVENTION

An object of the present invention is to provide a substrate processing apparatus capable of performing heat processing in a low oxygen atmosphere in a short time and moreover shortening the total time required for substrate processing.

Another object of the present invention is to provide a substrate processing apparatus capable of performing heat processing in a low oxygen atmosphere uniformly.

To settle the above disadvantage, a main aspect of the present invention is a substrate processing apparatus, comprising a processing chamber for performing heat processing for a substrate having a first face and a second face, a hot plate, disposed in the processing chamber, for performing heat processing for the substrate from the second face side, a gap forming member for maintaining a predetermined gap between the front face of the hot plate and the second face of the substrate, and a first supply section, disposed around the hot plate, for supplying gas for purge nearly parallel to the substrate placed on the hot plate with a gap forming member between them and toward the first face and the second face of the substrate.

In the present invention, gas for purge is supplied nearly parallel to the substrate placed on the hot plate with the gap forming member between them and toward the first face and the second face of the substrate. Thus, an atmosphere around the substrate can be exchanged for the gas for purge efficiently, and moreover the atmosphere around the substrate can be exchanged uniformly. Accordingly, heat processing in a low oxygen atmosphere can be performed in a short time, and moreover the total time required for substrate processing can be shortened. Besides, heat processing in the low oxygen atmosphere can be performed uniformly.

These objects and still other objects and advantages of the present invention will become apparent upon reading the following specification when taken in conjunction with the accompanying drawings.

DETAILED DESCRIPTION OF THE PREFERRED EMBODIMENT

The preferred embodiments of the present invention will be described below with reference to the drawings.

Figure 1:
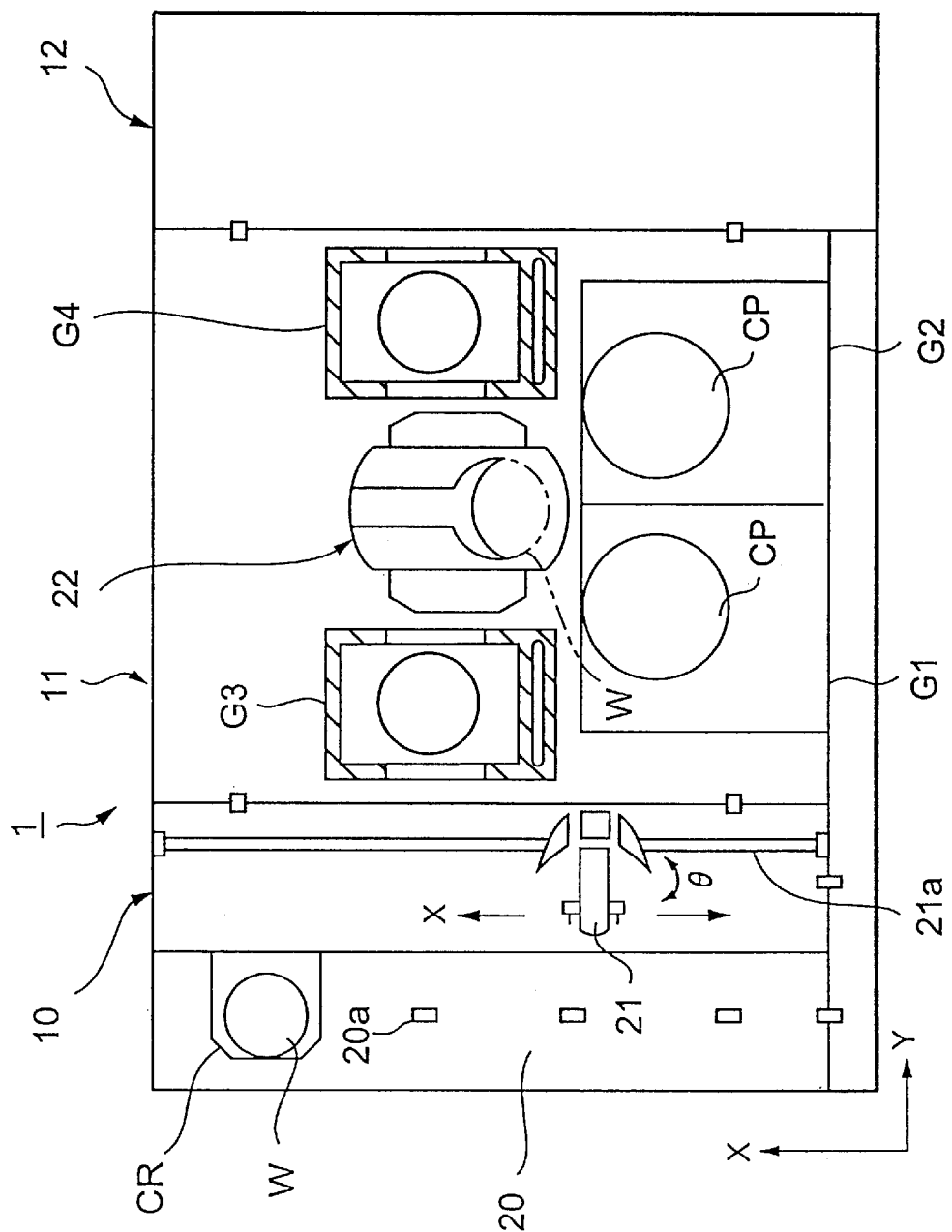
FIG. 1 is a plan view of an SOD system according to an embodiment of the present invention.
Figure 2:
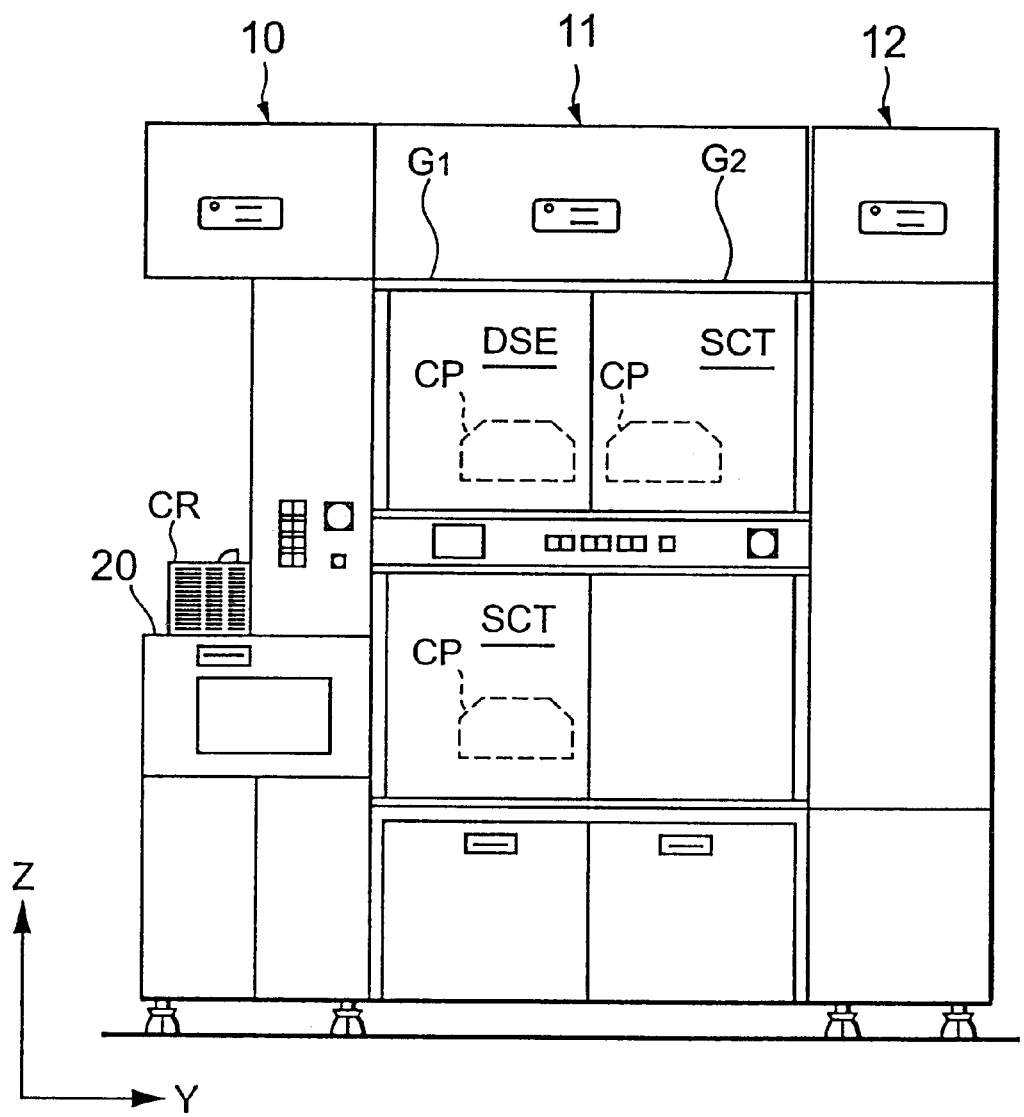
FIG. 2 is a front view of the SOD system shown in FIG. 1.
Figure 3:
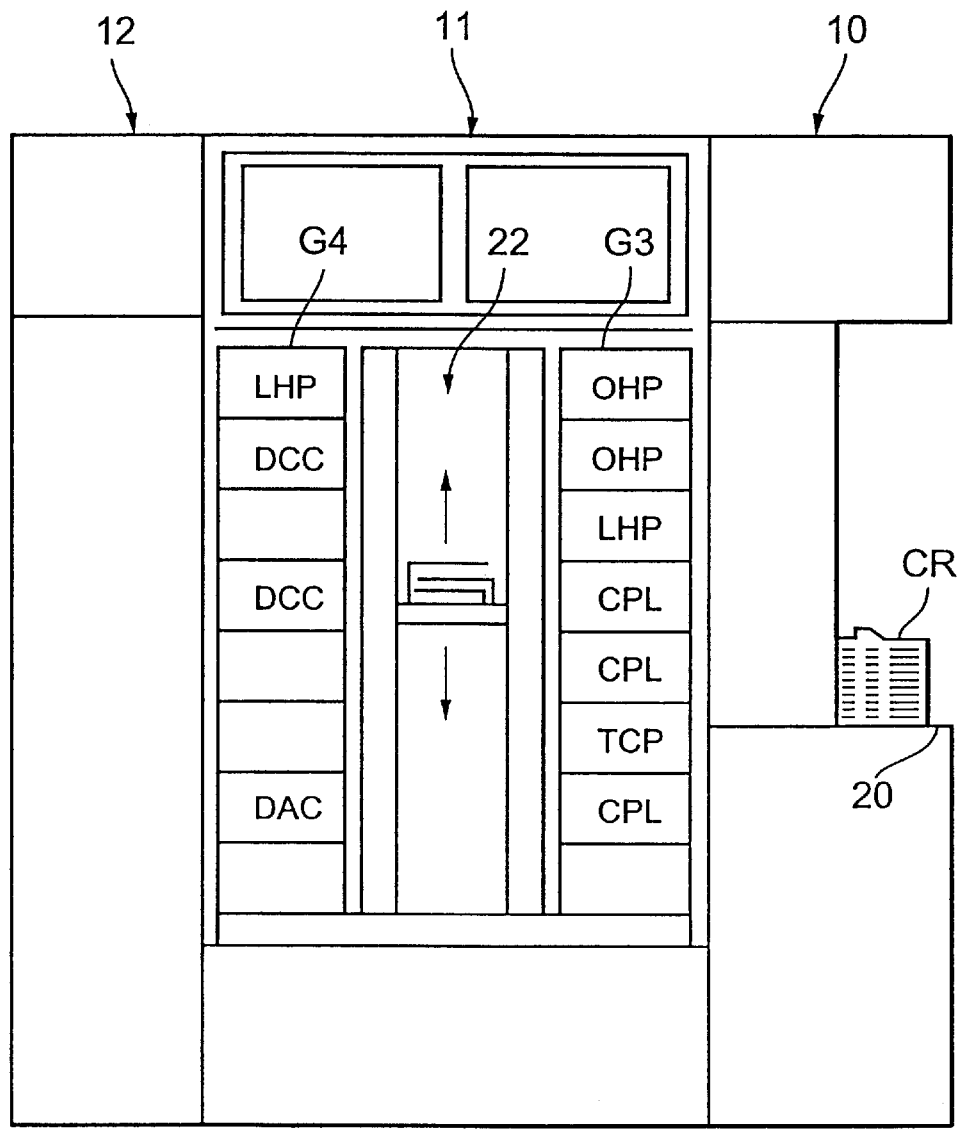
FIG. 3 is a rear view of the SOD system shown in FIG. 1.

FIG. 1 to FIG. 3 are views showing the entire structure of an SOD system according to an embodiment of the present invention, and FIG. 1 is a plan view, FIG. 2 is a front view, and FIG. 3 is a rear view.

The SOD system 1 has a structure in which a cassette block 10 for transferring a plurality of, for example, 25 semiconductor wafers (hereinafter referred to as wafers) w as substrates, as a unit, in a wafer cassette CR from/to the outside into/from the system and carrying the wafer W into/out of the wafer cassette CR, a processing block 11 in which various kinds of processing stations each for performing predetermined processing for the wafers W one by one in an SOD coating process are multi-tiered at predetermined positions, and a cabinet 12 in which a bottle of ammonia water, a bubbler, a drain bottle, and the like required in an aging process are provided are integrally connected.

In the cassette block 10, as shown in FIG. 1, a plurality of, for example, up to four wafer cassettes CR are mounted with respective wafer transfer ports facing the processing block 11 side at positions of projections 20a on a cassette mounting table 20 in a line in an X-direction. A wafer transfer body 21 movable in the direction of arrangement of cassettes (the X-direction) and in the direction of arrangement of wafers housed in the wafer cassette CR (a Z-vertical direction) selectively gets access to each of the wafer cassettes CR. The wafer transfer body 21 is also structured to be rotatable in a θ-direction so as to be accessible to a transfer and chill plate (TCP) included in a multi-tiered station section of a third group G3 on the processing block 11 side as will be described later.

In the processing block 11, as shown in FIG. 1, a vertical transfer-type main wafer transfer mechanism 22 is disposed in the center thereof. Around the main wafer transfer mechanism 22, all processing stations composing a group or a plurality of groups are multi-tiered. In this embodiment, four groups G1, G2, G3, and G4 each having multi-tiered stations are arranged. Multi-tiered stations of the first and second groups G1 and G2 are arranged side by side on the front side (the lower side in FIG. 1) of the system, multi-tiered stations of the third group G3 are arranged adjacent to the cassette block 10, and multi-tiered stations of the fourth group G4 are arranged adjacent to the cabinet 12.

As shown in FIG. 2, in the first group G1, an SOD coating processing station (SCT) for supplying an insulating film material while the wafer W is mounted on a spin chuck in a cup CP and applying a uniform insulating film on top of the wafer by rotating the wafer and a solvent exchange processing station (DSE) for supplying a chemical for exchange such as HMDS, heptane, or the like while the wafer W is mounted on a spin chuck in a cup CP and exchanging a solvent in the insulating film applied on top of the wafer for another solvent prior to a drying process are two-tiered from the bottom in order.

In the second group G2, an SOD coating processing station (SCT) is arranged at the upper tier. Incidentally, it is possible to arrange an SOD coating processing station (SCT), a solvent exchange processing station (DSE), or the like at the lower tier of the second group G2 if necessary.

As shown in FIG. 3, in the third group G3, two low-oxygen and high-temperature heat processing stations (OHP), a low-temperature heat processing station (LHP), two cooling processing stations (CPL), a transfer and chill plate (TCP), and a cooling processing station (CPL) are multi-tiered from the top in order. Here the low-oxygen and high-temperature heat processing station (OHP) has a hot plate on which the wafer W is mounted inside a sealable processing chamber, exhausts air from the center of the top portion of the processing chamber while $N_2$ is being discharged uniformly from a hole in the outer periphery of the hot plate, and performs high-temperature heat processing for the wafer W in a low-oxygen atmosphere. The low-temperature heat processing station (LHP) has a hot plate on which the wafer W is mounted and performs low-temperature heat processing for the wafer W. The cooling processing station (CPL) has a chill plate on which the wafer w is mounted and performs cooling processing for the wafer W. The transfer and chill plate (TCP) has a two-tiered structure with a chill plate for cooling the wafer W at the lower tier and a delivery table at the upper tier and performs transfer of the wafer W between the cassette block 10 and the processing block 11.

In the fourth group G4, a low-temperature heat processing station (LHP), two low-oxygen curing and cooling processing stations (DCC), and an aging processing station (DAC) are multi-tiered from the top in order. Here the low-oxygen curing and cooling processing station (DCC) has a hot plate and a chill plate so that they are adjacent to each other inside a sealable processing chamber, performs high-temperature heat processing for the wafer W in the low-oxygen atmosphere in which exchange for $N_2$ is performed and performs cooling processing for the wafer W subjected to heat processing. The aging processing station (DAC) introduces $NH_3 + H_2O$ into a sealable processing chamber to perform aging processing for the wafer W, whereby an insulating film material film on the wafer W is wet gelatinized.

Figure 4:
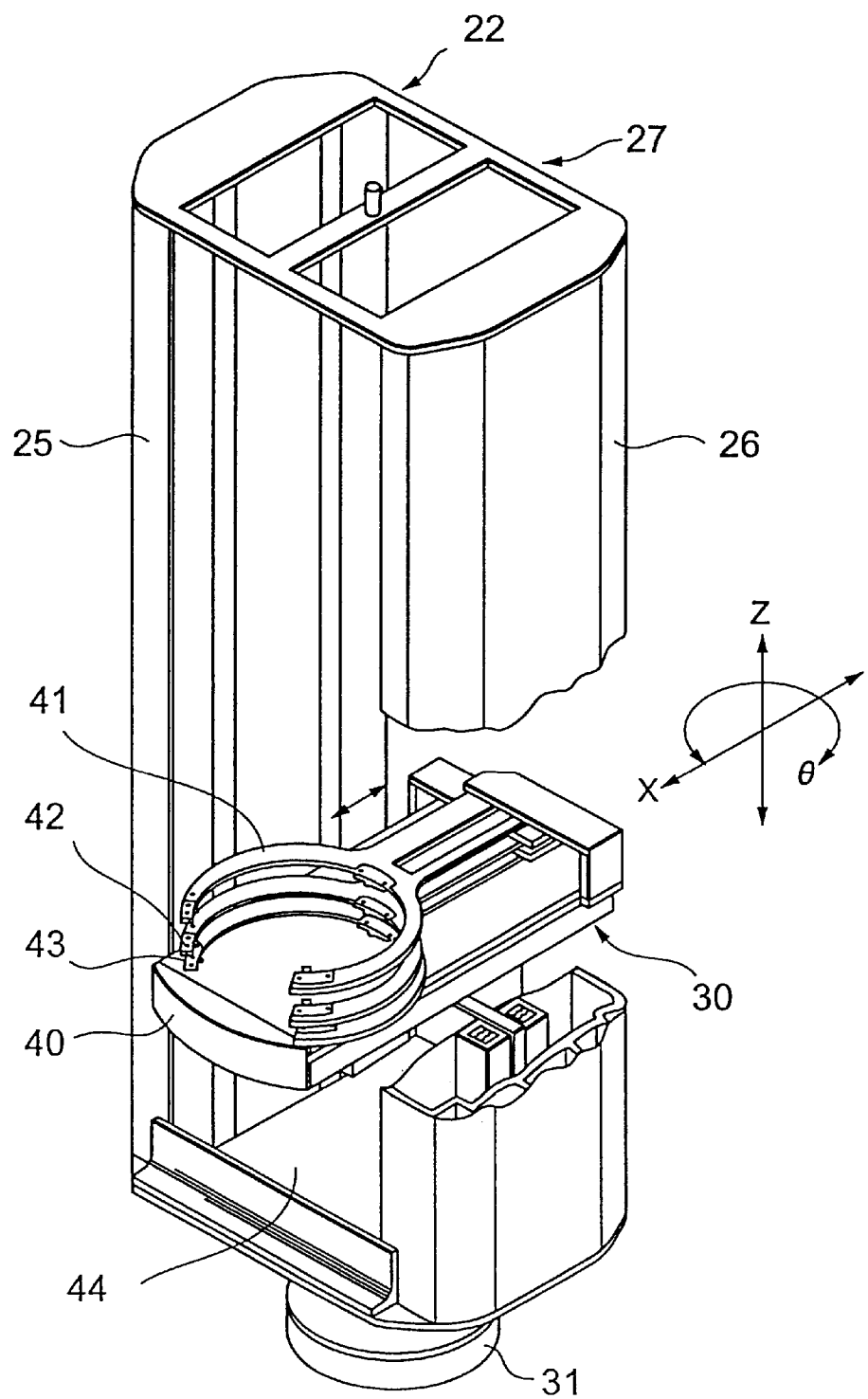
FIG. 4 is a perspective view of a main wafer transfer mechanism in the SOD system shown in FIG. 1.

FIG. 4 is a perspective view showing the appearance of the main wafer transfer mechanism 22. This main wafer transfer mechanism 22 is provided with a wafer transfer device 30 which is ascendable and descendable in the vertical direction (the Z-direction) inside a cylindrical supporter 27 composed of a pair of wall portions 25 and 26 which are connected with each other at respective upper ends and lower ends and face each other. The cylindrical supporter 27 is connected to a rotating shaft of a motor 31 and rotates integrally with the wafer transfer device 30 around the aforesaid rotating shaft by rotational driving force of the motor 31. Accordingly, the wafer transfer device 30 is rotatable in the θ-direction. For example, three tweezers are provided on a transfer base 40 of the wafer transfer device 30. These tweezers 41, 42, and 43 each have a shape and a size capable of freely passing through a side opening 44 between both the wall portions 25 and 26 of the cylindrical supporter 27 so as to be movable back and forth in the X-direction. The main wafer transfer mechanism 22 allows the tweezers 41, 42, and 43 to get access to processing stations disposed thereabout to transfer the wafer W from/to each of these processing stations.

Figure 5:
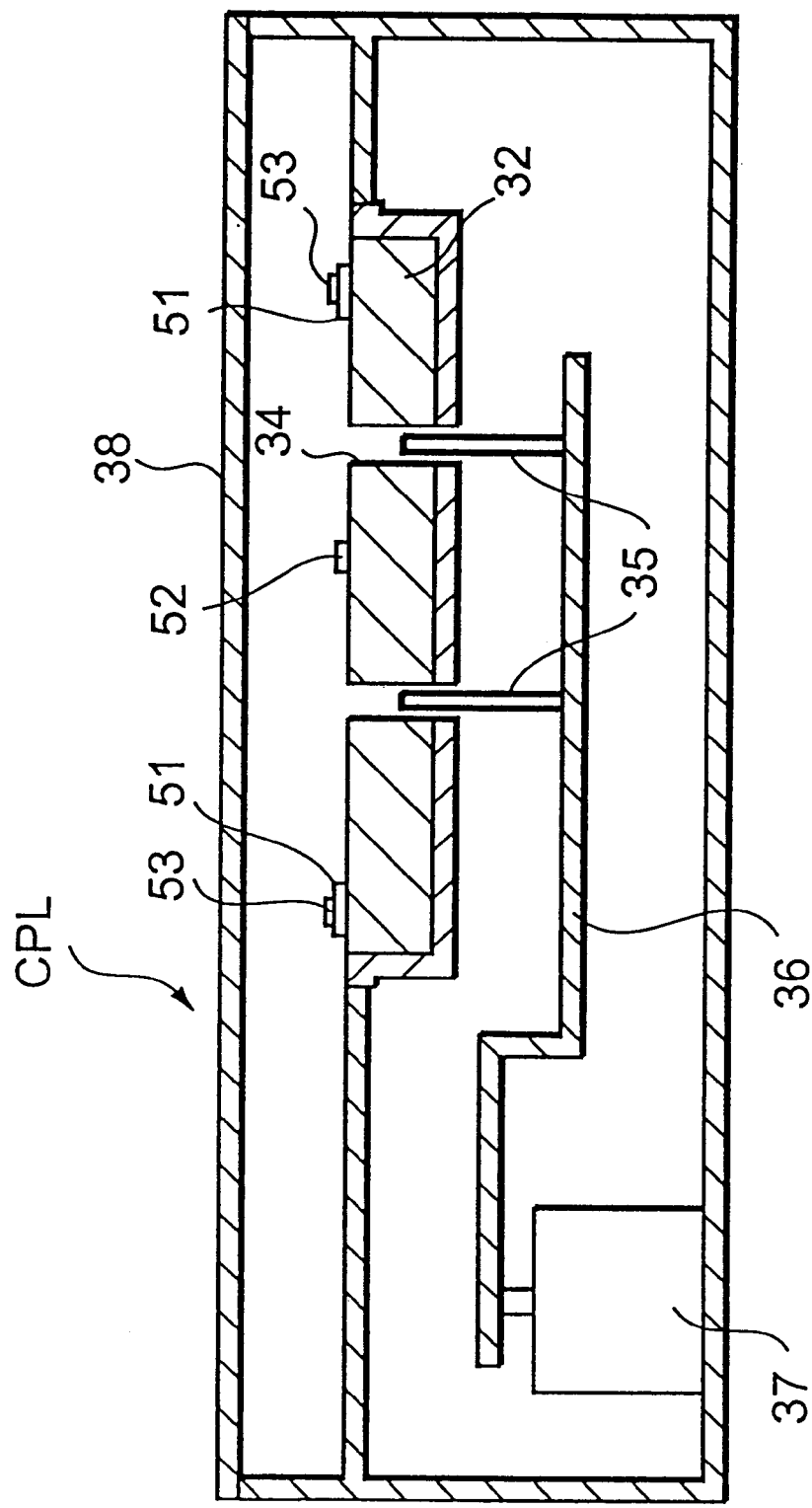
FIG. 5 is a sectional view of a cooling processing station according to the embodiment of the present invention.
Figure 6:
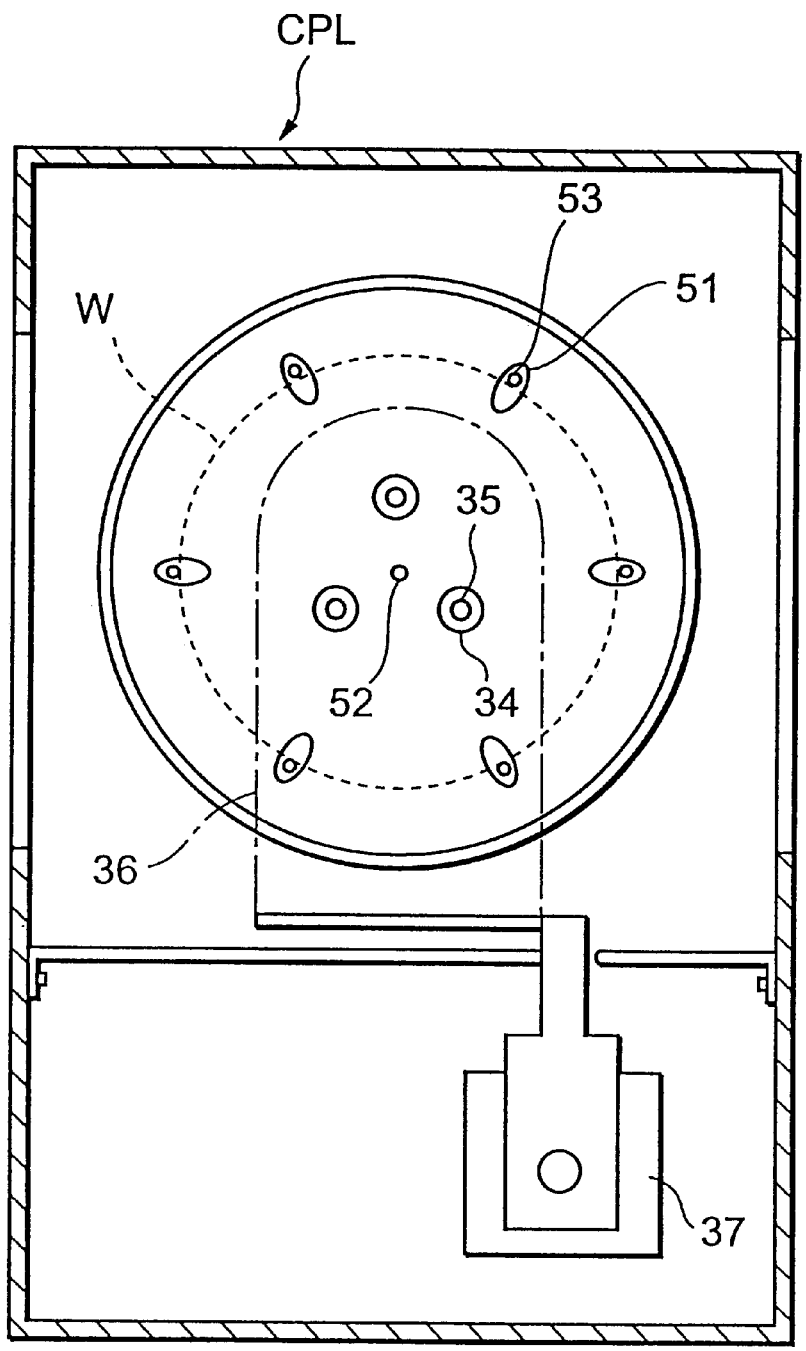
FIG. 6 is a plan view of the cooling processing station shown in FIG. 5.

FIG. 5 is a sectional view of the aforesaid cooling processing station (CPL), and FIG. 6 is a plan view thereof.

A chill plate 32 as a plate for performing cooling processing for the wafer w is disposed nearly in the center of the cooling processing station (CPL). The chill plate 32 has, for example, a circular shape with a diameter slightly larger than that of the wafer W, and a cooling pipe the illustration of which is omitted is disposed inside the chill plate 32, and cooling water is circulated through the cooling pipe.

Through-holes 34 are bored through the front face and the rear face of the chill plate 32 at a plurality of, for example, three points. A plurality of, for example, three supporting pins 35 for delivering the wafer W are inserted into these through-holes 34 so as to freely protrude therefrom or retract thereinto. These supporting pins 35 are coupled together on the rear face side of the chill plate 32 with a coupling member 36 disposed on the rear face side of the chill plate 32. The coupling member 36 is connected to an ascent/descent cylinder 37 disposed on the rear face side of the chill plate 32. The supporting pins 35 protrude from and retract into the front face of the chill plate 32 by the ascending and descending motions of the ascent/descent cylinder 37. The supporting pins 35 transfer the wafer W from/to the main wafer transfer mechanism 22 while protruding from the front face of the chill plate 32. After receiving the wafer W from the main wafer transfer mechanism 22, the supporting pins 35 lower and retract into the chill plate 32, whereby the wafer W is closely placed on the front face of the chill plate 32, which allows the wafer W to undergo cooling processing.

A cooling cover 38 is disposed over the chill plate 32. Incidentally, it is possible that supporting pins are provided on the upper face of the cooling cover 38 to thereby compose a waiting section for the wafer W.

Further in this cooling processing station (CPL), proximity sheets 51 each as a gap forming member for holding the wafer W while the wafer w is lifted off the chill plate 32 without being closely mounted on the chill plate 32 are disposed at a plurality of, for example, six points in the outer peripheral portion of a wafer W mounting position. Moreover, a proximity pin 52 as a gap forming member is disposed at the center of the wafer W mounting position.

Each of the proximity sheets 51 extends toward the outside of the wafer W mounting position, and a guide 53 for guiding a substrate is disposed at a point to which each of the proximity sheets 51 extends.

The proximity sheets 51 and the proximity pin 52 in this cooling processing station (CPL) are set, for example, at a height of about 0.1 mm. Thus, a gap between the chill plate 32 and the wafer W is extremely small, thereby enhancing a cooling effect.

Figure 7:
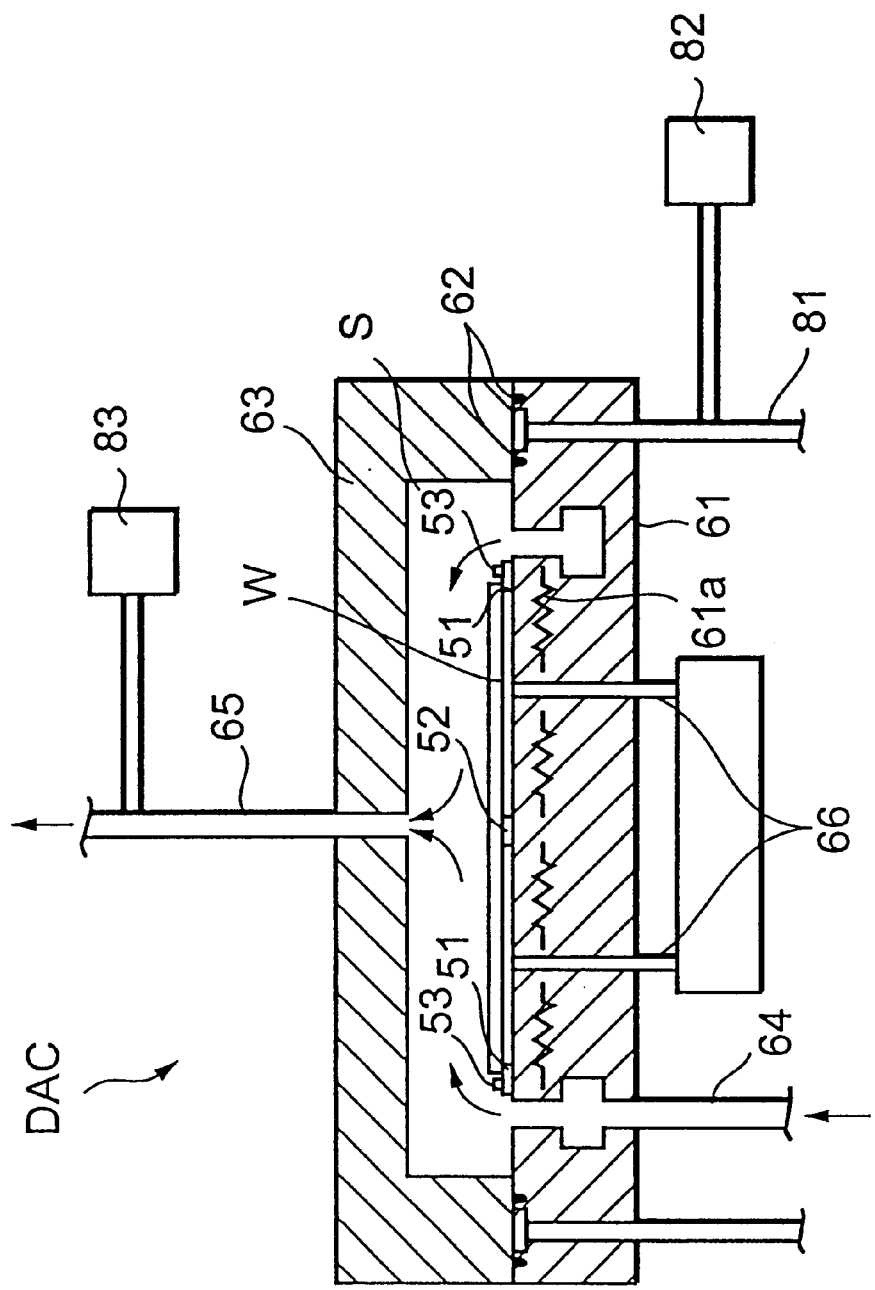
FIG. 7 is a sectional view of an aging processing station according to the embodiment of the present invention.

FIG. 7 is a sectional view of the aforesaid aging processing station (DAC).

The aging processing station (DAC) includes a hot plate 61, for example, made of ceramics, with a built-in heater 61a, a cover 63 which is closely attached to the peripheral edge portion of the hot plate 61 with a sealing member 62 between them so that a space S composing a processing chamber is formed above the hot plate 61 and which is attached to and detached from the hot plate 61, a gas supply passage 64 the supply port of which is formed at the front face of the hot plate 61 in such a manner to surround the wafer placed on the hot plate 61, an exhaust passage 65 the inlet port of which is formed at the center of the cover 63, and three raising and lowering pins 66 each for raising and lowering the wafer W between the hot plate 61 and a position above the hot plate 61.

In this aging processing station (DAC), ammonia is vaporized by the bubbler and a mass flow controller (not illustrated) in the side cabinet 12 and supplied into the processing chamber S through the aforesaid gas supply passage 64, and exhaust air from the exhaust passage 65 is trapped by means of a drain tank (not illustrated) in the side cabinet 12.

Besides, in the aging processing station (DAC), the proximity sheets 51 and the proximity pin 52 each as a gap forming member with a height of about 0.1 mm and the guides 53 are provided as with the aforesaid cooling processing station (CPL).

Figure 8:
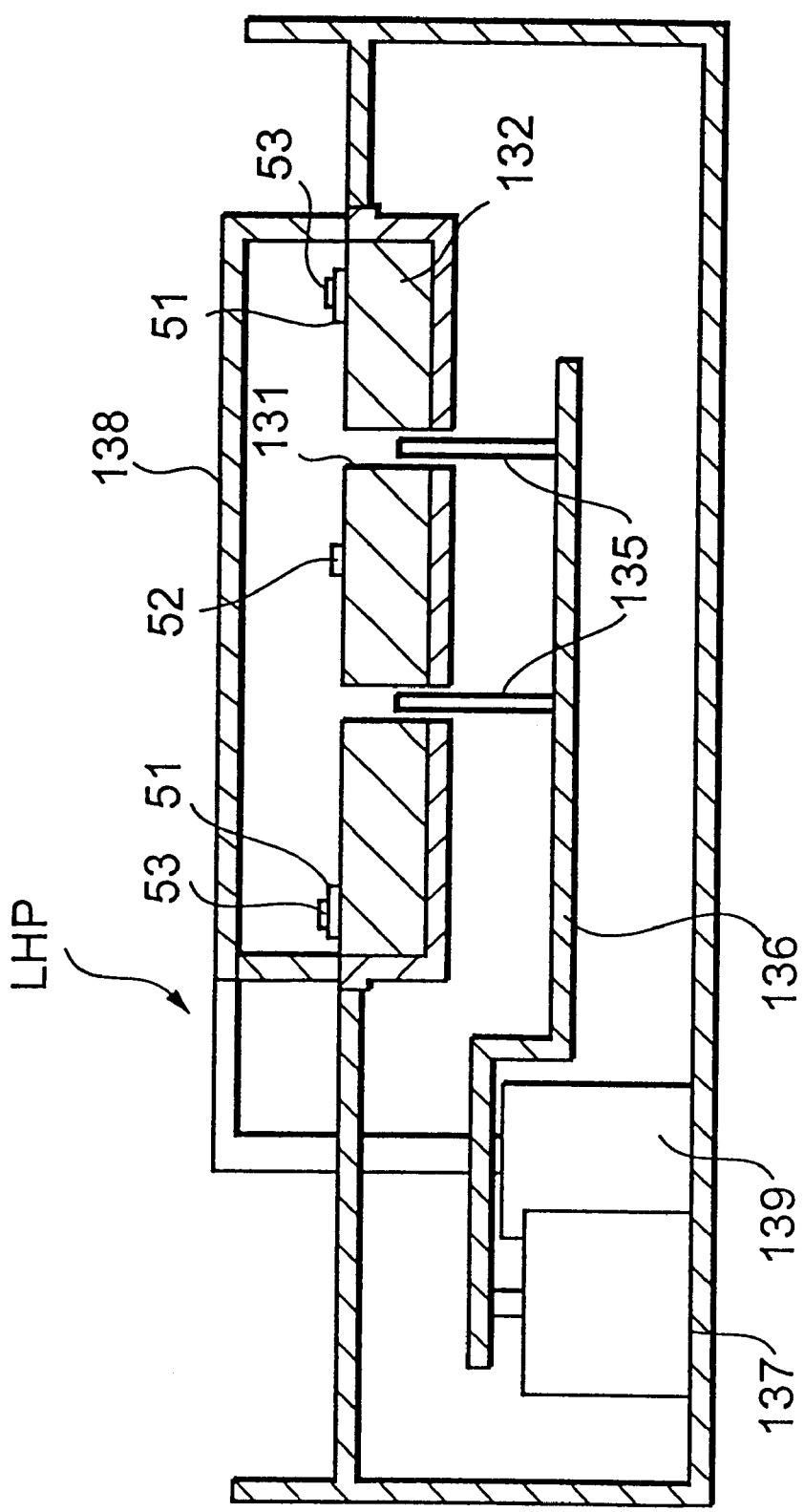
FIG. 8 is a sectional view of a low-temperature heat processing station according to the embodiment of the present invention.

FIG. 8 is a sectional view of the aforesaid low-temperature heat processing station (LHP).

A hot plate 132 as a plate for performing heat processing for the wafer W is disposed nearly at the center of the low temperature heat processing station (LHP). A heater the illustration of which is omitted is embedded in the hot plate 132.

Through-holes 134 are bored through the front face and the rear face of the hot plate 132 at a plurality of, for example, three points. A plurality of, for example, three supporting pins 135 for delivering the wafer W are inserted into these through-holes 134 so as to freely protrude therefrom or retract thereinto. These supporting pins 135 are coupled together on the rear face side of the hot plate 132 with a coupling member 136 disposed on the rear face side of the hot plate 132. The coupling member 136 is connected to an ascent/descent cylinder 137 disposed on the rear face side of the hot plate 132. The supporting pins 135 protrude from and retract into the front face of the hot plate 132 by the ascending and descending motions of the ascent/descent cylinder 137.

An ascent/descent cover 138 is disposed over the hot plate 132. The ascent/descent cover 138 can be raised and lowered by an ascent/descent cylinder 139. When the ascent/descent cover 138 lowers as illustrated, an enclosed space for performing heat processing is formed between the ascent/descent cover 138 and the hot plate 132.

Further in this low-temperature heat processing station (LHP), the proximity sheets 51 and the proximity pin 52 each as a gap forming member with a height of about 0.1 mm and the guides 53 are provided as with the aforesaid aging processing station (DAC) and cooling processing station (CPL). Effect on heat processing can be raised by reducing a gap between the hot plate 132 and the wafer W as described above.

Figure 9:
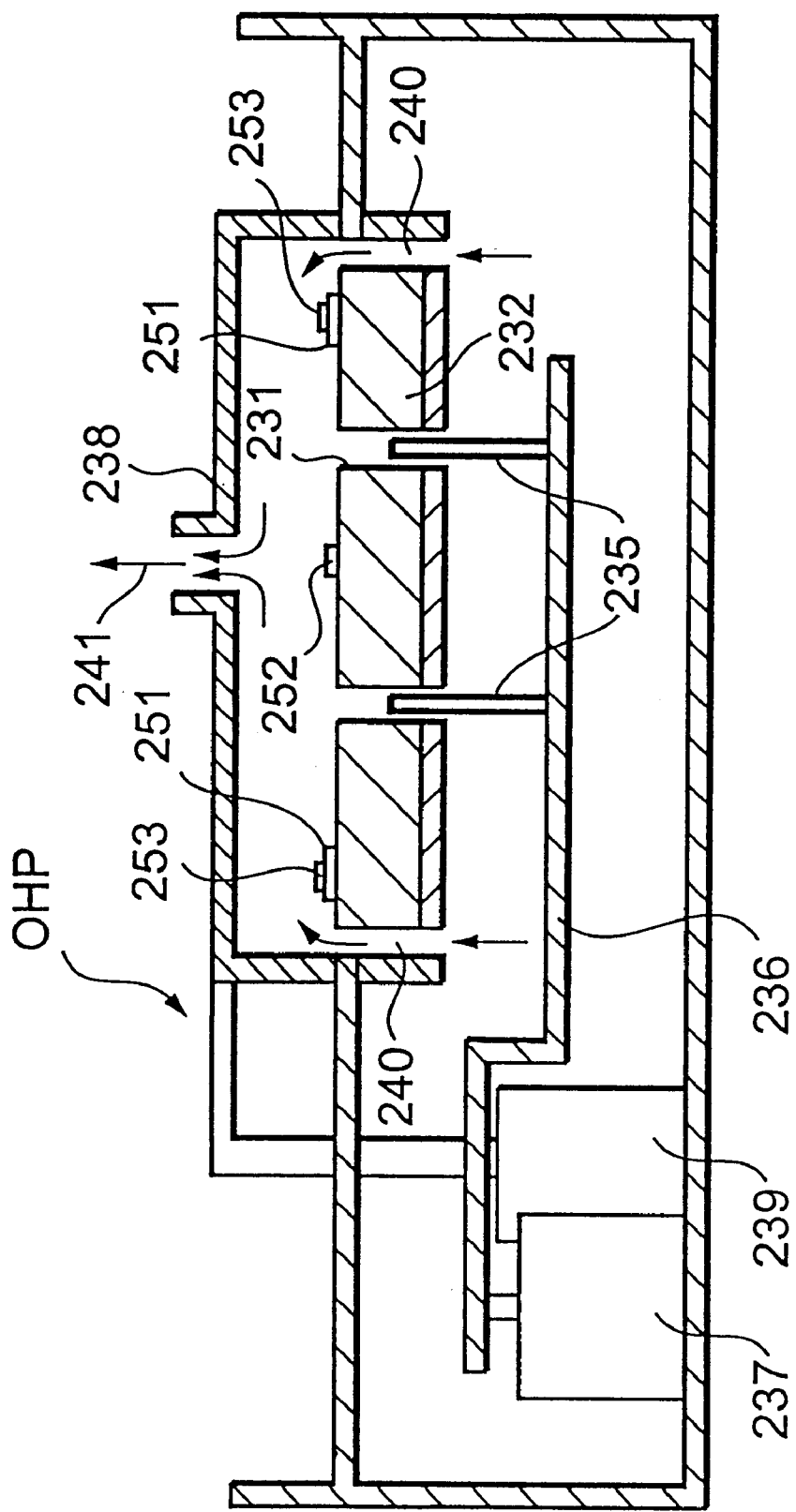
FIG. 9 is a sectional view of a low-oxygen and high-temperature heat processing station according to the embodiment of the present invention.

FIG. 9 is a sectional view of the aforesaid low-oxygen and high-temperature heat processing station (OHP).

A hot plate 232 as a plate for performing heat processing for the wafer W is disposed nearly at the center of the low-oxygen and high-temperature heat processing station (OHP). A heater the illustration of which is omitted is embedded in the hot plate 232.

Through-holes 234 are bored through the front face and the rear face of the hot plate 232 at a plurality of, for example, three points. A plurality of, for example, three supporting pins 235 for delivering the wafer W are inserted into these through-holes 234 so as to freely protrude therefrom or retract thereinto. These supporting pins 235 are coupled together on the rear face side of the hot plate 232 with a coupling member 236 disposed on the rear face side of the hot plate 232. The coupling member 236 is connected to an ascent/descent cylinder 237 disposed on the rear face side of the hot plate 232. The supporting pins 235 protrude from and retract into the front face of the hot plate 232 by the ascending and descending motions of the ascent/descent cylinder 237.

An ascent/descent cover 238 is disposed over the hot plate 232. The ascent/descent cover 238 can be raised and lowered by an ascent/descent cylinder 239. When the ascent/descent cover 238 lowers as illustrated, an enclosed space for performing heat processing is formed between the ascent/descent cover 238 and the hot plate 232.

Further, high-temperature heat processing is performed for the wafer W in a low-oxygen atmosphere by exhausting air from an exhaust port 241 in the center of the ascent/descent cover 238 while discharging $N_2$ gas uniformly from an outer peripheral hole 240 of the hot plate 232.

Although proximity sheets 251 and a proximity pin 252 each as a gap forming member and guides 253 are provided in this low-oxygen and high-temperature heat processing station (OHP) as with the aforesaid aging processing station (DAC), cooling processing station (CPL), and low-temperature heat processing station (LHP), the proximity sheets 251 and the proximity pin 252 each have a height of 0.2 mm, which is twice the heights of those of the aforesaid aging processing station (DAC), cooling processing station (CPL), and low-temperature heat processing station (LHP). Thereby, on the occasion of exchange for $N_2$ gas, air does not remain in the gap between the wafer W and the hot plate 232, which makes it possible to reduce the time to make the inside of the enclosed space between the ascent/descent cover 283 and the hot plate 232 as a processing chamber a desired low-oxygen atmosphere, thereby enabling heat processing in a low oxygen atmosphere in a short time.

Figure 10:
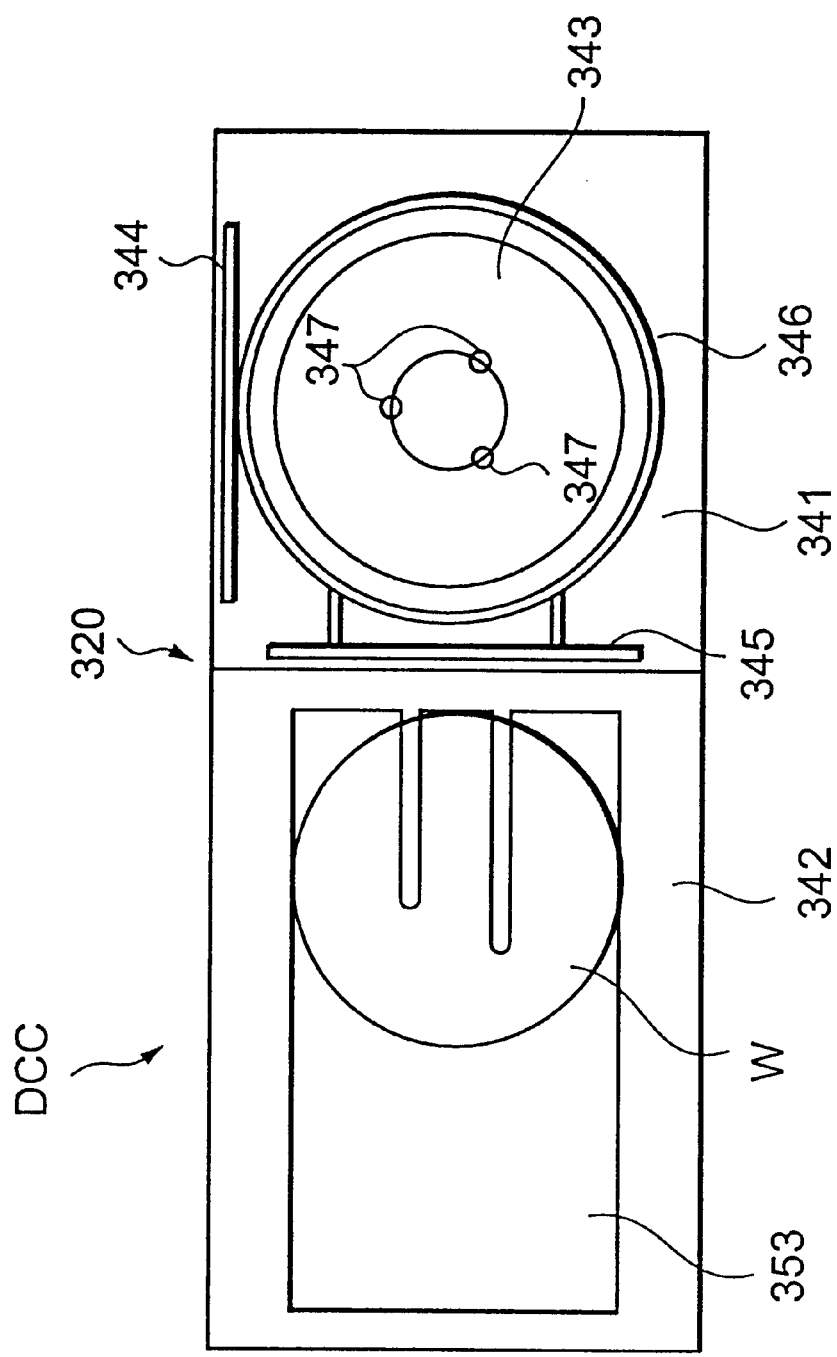
FIG. 10 is a plan view of a low-oxygen curing and cooling processing station according to the embodiment of the present invention.
Figure 11:
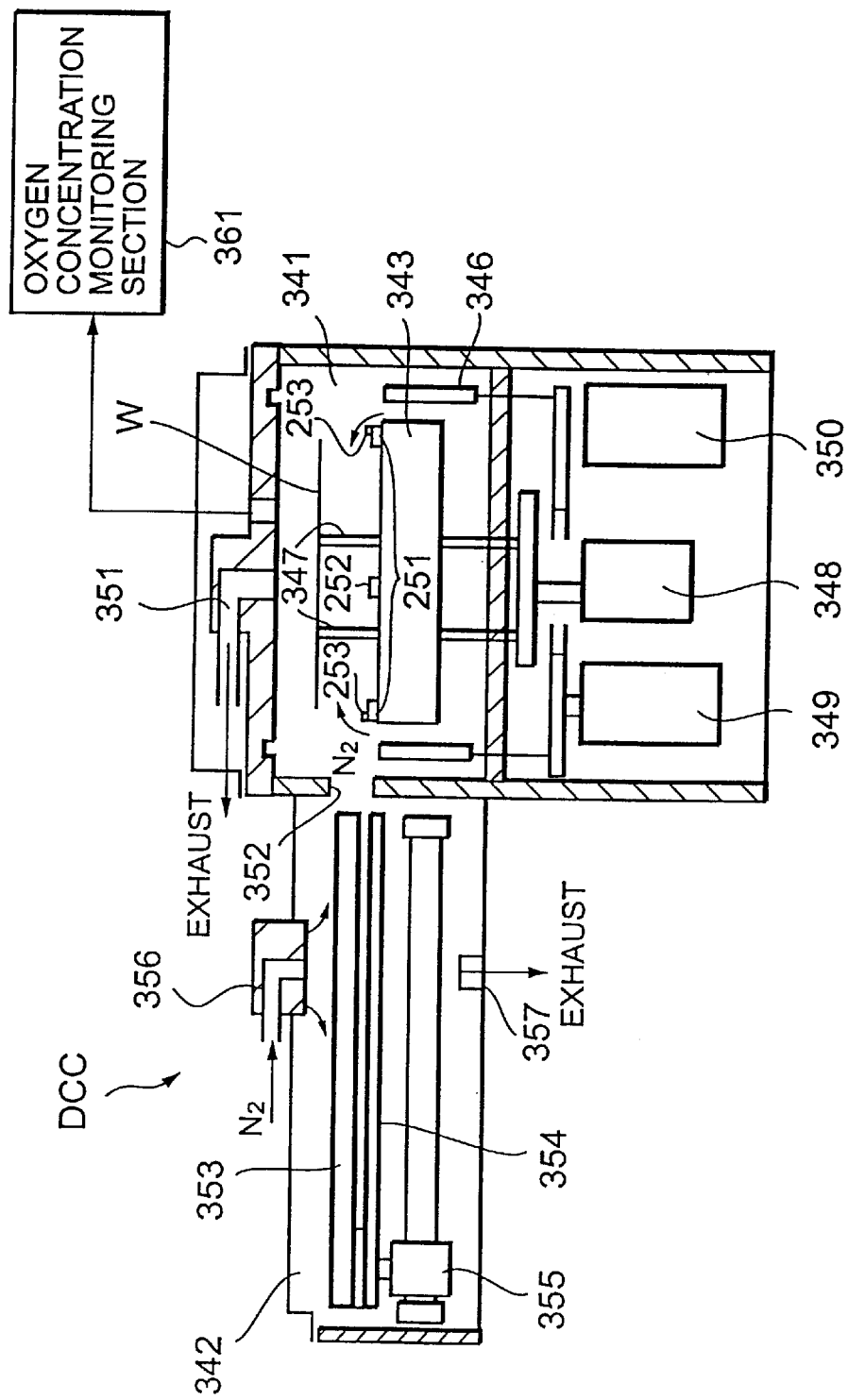
FIG. 11 is a sectional view of the low-oxygen curing and cooling processing station shown in FIG. 10.

FIG. 10 is a plan view of the aforesaid low-oxygen curing and cooling processing station (DCC), and FIG. 11 is a sectional view thereof.

The low-oxygen curing and cooling processing station (DCC) has a heat processing chamber 341 and a cooling processing chamber 342 provided adjacent thereto, and the heat processing chamber 341 has a hot plate 343 the set temperature of which can be 200° C. to 470° C. The low-oxygen curing and cooling processing station (DCC) further has a first gate shutter 344 which is opened and shut when the wafer W is transferred from/to the main wafer transfer mechanism 22, a second gate shutter 345 for opening and shutting a portion between the heat processing chamber 341 and the cooling processing chamber 342, and a ring shutter 346 which is raised and lowered together with the second gate shutter 345 while surrounding the wafer W around the hot plate 343. Moreover, the hot plate 343 is provided with three lifting pins 347 for raising and lowering the wafer W while the wafer w is mounted thereon are provided to be ascendable and descendable. It should be mentioned that a shielding screen may be provided between the hot plate 343 and the ring shutter 346.

Provided below the heat processing chamber 341 are a raising and lowering mechanism 348 for raising and lowering the aforesaid three lifting pins 347, a raising and lowering mechanism 349 for raising and lowering the ring shutter 346 together with the second gate shutter 345, and a raising and lowering mechanism 350 for raising and lowering the first gate shutter 344 to open and shut it.

$N_2$ gas as gas for purge is supplied from the ring shutter 346 into the heat processing chamber 341 as will be described later. An exhaust pipe 351 is connected to the top portion of the heat processing chamber 341, and air inside the heat processing chamber 341 is exhausted through the exhaust pipe 351. Further connected to the heat processing chamber 341 is an oxygen concentration monitoring section 361 for monitoring oxygen concentration inside the heat processing chamber 341. The inside of the heat processing chamber 341 is maintained in a low-oxygen concentration (for example, 50 ppm or less) atmosphere by exhausting air while supplying $N_2$ gas as will be described later. It is naturally suitable to dispose the oxygen concentration monitoring section on an exhaust route such as an exhaust pipe or the like.

The heat processing chamber 341 and the cooling processing chamber 342 communicate with each other via a communicating port 352, and a chill plate 353 for cooling the wafer W while the wafer W is mounted thereon is structured to be movable in a horizontal direction along a guide plate 354 by means of a moving mechanism 355. Thereby, the chill plate 352 can get into the heat processing chamber 341 through the communicating port 352, receives the wafer W which has been heated by the hot plate 343 in the heat processing chamber 341 from the lifting pins 347, carries the wafer W into the cooling processing chamber 342, and returns the wafer W to the lifting pins 347 after the wafer W is cooled.

It should be mentioned that the set temperature of the chill plate 353 is, for example, 15° C. to 25° C., and the applicable temperature range of the wafer W to be cooled is, for example, 200° C. to 470° C.

Moreover, the cooling processing chamber 342 is structured SO that inert gas such as $N_2$ or the like is supplied thereinto via a supply pipe 356 and so that air inside the cooling processing chamber 342 is exhausted to the outside via an exhaust pipe 357, whereby the inside of the cooling processing chamber 342 is maintained in a low oxygen concentration (for example, 50 ppm or less) atmosphere, similarly to the heat processing chamber 341.

Figure 13:
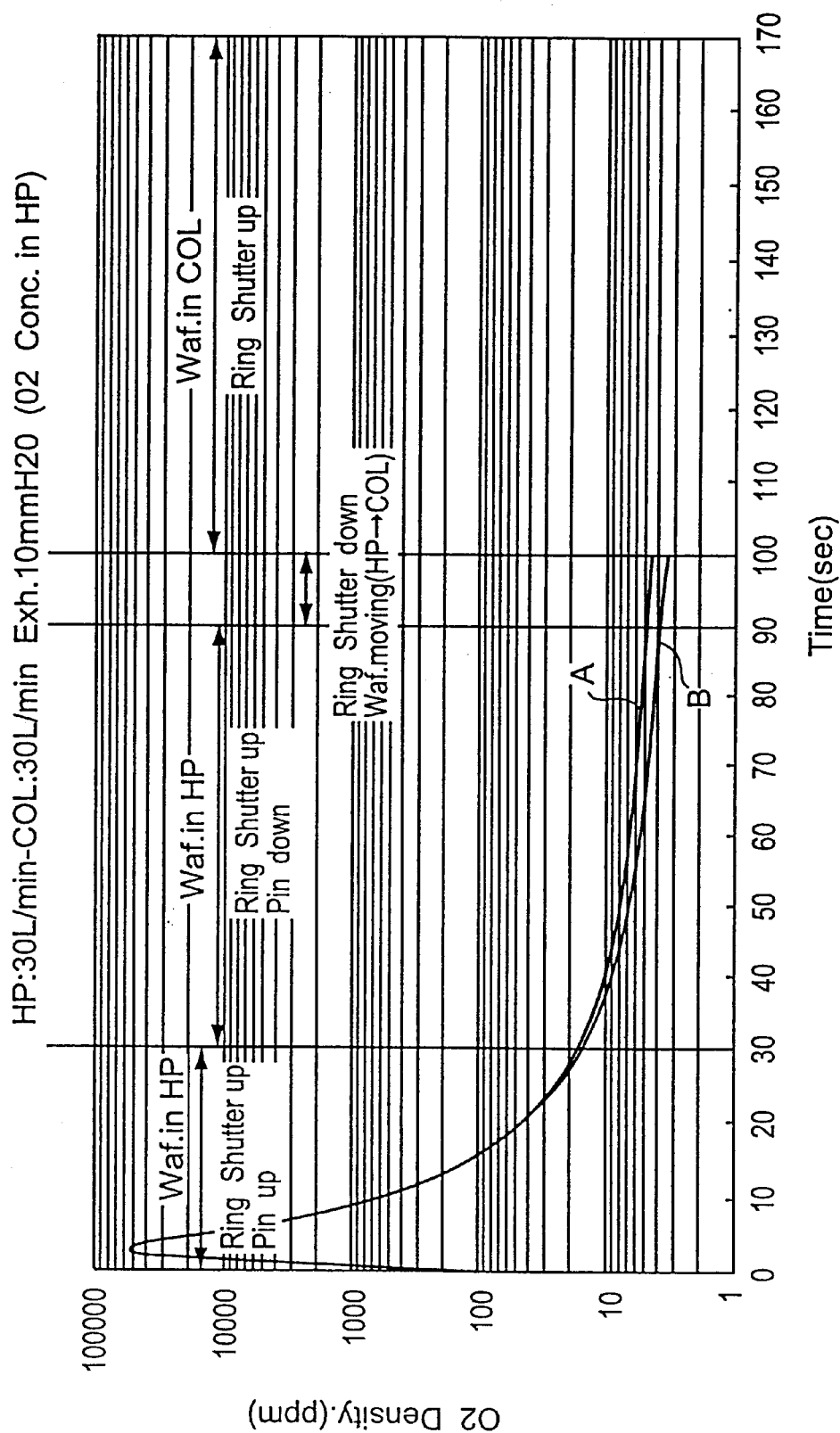
FIG. 13 shows results of experiments carried out for confirmation of effects of the present invention.

Provided on the hot plate 343 are the same proximity sheets 251 and proximity pin 252 each with a height of about 0.2 mm and guides 253 as those of the aforesaid low-oxygen and high temperature heat processing station (OHP). Thereby, on the occasion of exchange for $N_2$ gas, air does not remain in a gap between the wafer W and the hot plate 343, which makes it possible to reduce time to make the inside of the heat processing chamber 341 a desired low-oxygen atmosphere, thereby enabling heat processing under low oxygen in a short time. FIG. 13 shows results of experiments conducted to confirm the aforesaid effects. A in FIG. 13 shows the temporal change of oxygen concentration inside the gap between the wafer W and the hot plate 343 when the gap is 0.1 mm, and B in FIG. 13 shows the temporal change of oxygen concentration inside the gap between the wafer W and the hot plate 343 when the gap is 0.2 mm. From FIG. 13, it can be seen that oxygen concentration lowers as the gap between the wafer W and the hot plate 343 increases.

Incidentally, the structure of a chill plate disposed at the lower tier of the aforesaid transfer and chill plate (TCP) is almost the same as that of the cooling processing station (CPL) shown in FIG. 5 and FIG. 6, and similarly proximity sheets and a proximity pin each with a height of 0.1 mm and guides are provided on the chill plate.

Figure 14:
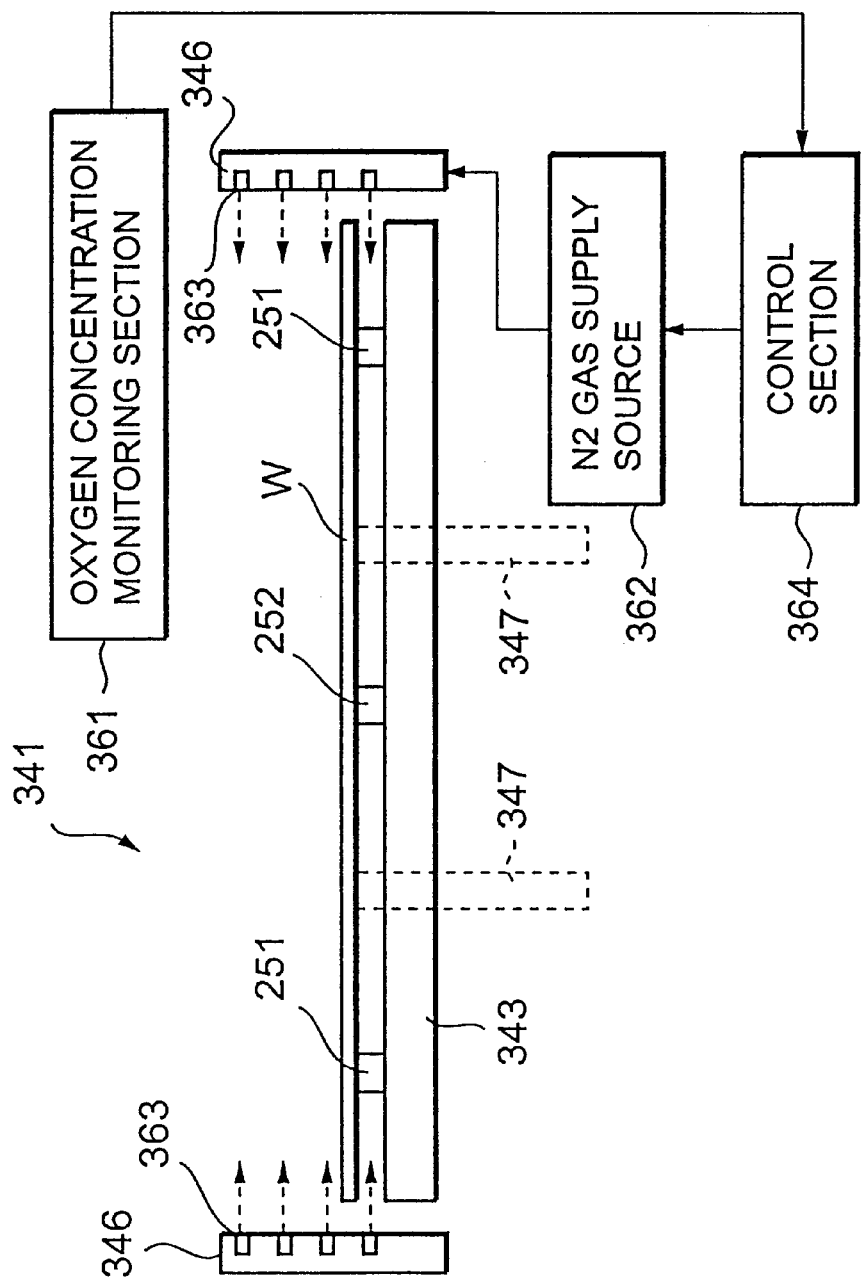
FIG. 14 is a sectional view of a heat processing chamber in the low-oxygen curing and cooling processing station shown in FIG. 10.

FIG. 14 is a view showing the structure of the inside of the heat processing chamber 341 in the aforesaid low-oxygen curing and cooling processing station (DCC). FIG. 14 shows a state in which the ring shutter 346 is raised and surrounds the wafer W mounted at a heat processing position on the hot plate 343.

$N_2$ gas is supplied from an $N_2$ gas supply source 362 into the ring shutter 346. A large number of jet ports 363 each for jetting $N_2$ gas to the wafer W on the hot plate 343 nearly parallel to the wafer W are provided at the inner wall of the ring shutter 346.

In order to supply $N_2$ gas toward both the front and rear faces of the wafer W disposed on the hot plate 343 with the proximity sheets and the proximity pin between them, some of the large number of jet ports 363 are provided at positions lower than the position of the rear face of the wafer W disposed on the hot plate 343 with the proximity sheets and the proximity pin between them, and the other jet ports 363 are provided at positions higher than the position of the front face of the same wafer W.

A control section 364 controls the amount of supply of $N_2$ gas from the $N_2$ gas supply source 362 and the amount of exhaust of air via the exhaust pipe 351 according to oxygen concentration inside the heat processing chamber 341 monitored by the oxygen concentration monitoring section 361. The aforesaid control enables a reduction in consumption of $N_2$ gas.

The wafer W is transferred from the main wafer transfer mechanism 22 onto the lifting pins 347 while the lifting pins 347 are raised. Thereafter, the first and second gate shutters 344 and 345 are shut. $N_2$ gas is supplied from the $N2_2$ gas supply source 362 into the heat processing chamber 341, and air inside the heat processing chamber 341 is exhausted via the exhaust pipe 351. In this stage, a large quantity of $N_2$ gas, around 30 l per minute, is supplied. Consequently, air remaining in the heat processing chamber 341 is pushed out from the exhaust pipe 351, whereby purge progresses promptly.

From the aforesaid state, the lifting pins 347 are lowered and the wafer W is placed on the hot plate 343 with the proximity sheets and the proximity pin between them. In this embodiment, $N_2$ gas is supplied parallel to the wafer W and toward both the front and rear faces of the wafer W as described above, whereby an atmosphere around the wafer W can be exchanged for $N_2$ gas efficiently, and moreover the atmosphere around the wafer W can be exchanged uniformly.

Thereafter, when oxygen concentration is stabilized at not more than a fixed value, the supply of $N_2$ gas is reduced to a small quantity of $N_2$ gas, around 10 l per minute, and then only this small quantity of $N_2$ gas continues to be supplied. The consumption of $N_2$ gas can be reduced by decreasing the supply of $N_2$ gas as described above.

Figure 12:
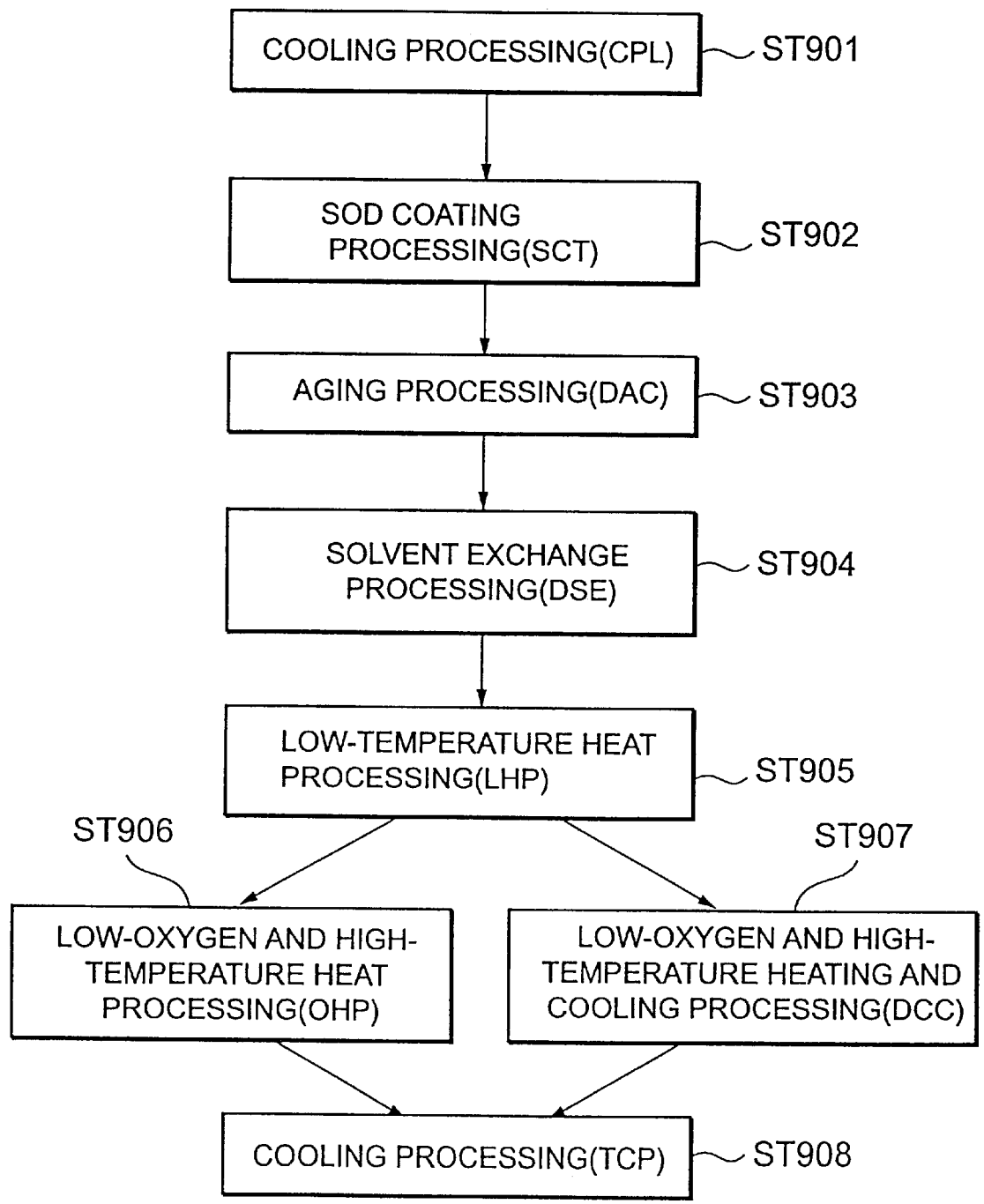
FIG. 12 is a processing flowchart of the SOD system shown in FIG. 1.

Next, operations in the SOD system 1 thus structured will be explained. FIG. 12 shows a processing flow in this SOD system 1.

First, in the cassette block 10, the unprocessed wafer W is transferred from the wafer cassette CR to the delivery table in the transfer and chill plate (TCP) included in the third group G3 on the processing block 11 side by means of the wafer transfer body 21.

The wafer W transferred to the delivery table in the transfer and chill plate (TCP) is transferred to the cooling processing station (CPL) by means of the main wafer transfer mechanism 22. In the cooling processing station (CPL), the wafer W is cooled to a temperature suitable for processing in the SOD coating processing station (SCT) (step 901).

The wafer W which has undergone the cooling processing in the cooling processing station (CPL) is transferred to the SOD coating processing station (SCT) via the main wafer transfer mechanism 22. In the SOD coating processing station (SCT), the wafer W is subjected to SOD coating processing (step 902).

The wafer W which has undergone the SOD coating processing in the SOD coating processing station (SCT) is transferred to the aging processing station (DAC) via the main wafer transfer mechanism 22. In the aging processing station (DAC), $NH_3+H_2O$ is introduced into the processing chamber to thereby perform aging processing for the wafer W, whereby an insulating film material film on the wafer W is gelatinized (step 903).

The wafer W which has undergone the aging processing in the aging processing station (DAC) is transferred to the solvent exchange processing station (DSE) via the main wafer transfer mechanism 22. In the solvent exchange processing station (DSE), a chemical for exchange is supplied to the wafer W and processing for exchanging a solvent in the insulating film applied on top of the wafer for another solvent is performed (step 904).

The wafer W which has undergone the exchange processing in the solvent exchange processing station (DSE) is transferred to the low-temperature heat processing station (LHP) by means of the main wafer transfer mechanism 22. In the low-temperature processing station (LHP), the wafer W undergoes low-temperature heat processing (step 905).

The wafer W which has undergone the low-temperature heat processing in the low-temperature heat processing station (LHP) is transferred to the low-oxygen and high-temperature heat processing station (OHP) by means of the main wafer transfer mechanism 22. In the low-oxygen and high-temperature heat processing station (OHP), the wafer W undergoes high-temperature heat processing in a low-oxygen atmosphere (step 906). Alternatively, the wafer W which has undergone the low-temperature heat processing in the low-temperature heat processing station (LHP) is transferred to the low-oxygen curing and cooling processing station (DCC) by means of the main wafer transfer mechanism 22. In the low-oxygen curing and cooling processing station (DCC), the wafer W undergoes high temperature heat processing in a low-oxygen atmosphere and then cooling processing (step 907).

Either of the aforesaid step 906 or step 907 is selected properly depending on an insulating material applied onto the wafer W.

The wafer W which has undergone the processing in the aforesaid step 906 or step 907 is transferred to the chill plate in the transfer and chill plate (TCP) by means of the main wafer transfer mechanism 22. The wafer W undergoes cooling processing on the chill plate in the transfer and chill plate (TCP) (step 908).

The wafer W which has undergone the cooling processing on the chill plate in the transfer and chill plate (TCP) is transferred to the wafer cassette CR via the wafer transfer body 21 in the cassette block 10.

In the SOD system 1 of this embodiment, the aging processing station (DAC) for performing aging processing for the wafer W coated with the insulating film material and the solvent exchange processing station (DSE) for performing solvent exchange processing for the wafer W which has undergone aging processing are integrated with the system as described above, whereby total time required for substrate processing is extremely shortened. In addition, the aging processing station (DAC) and the solvent exchange processing station (DSE) function as, so to speak, buffers for temporarily holding the wafer W for the low-oxygen and high-temperature heat processing station (OHP) and the low-oxygen curing and cooling processing station (DCC), which enables adjustment of tact times.

Next, modified examples of the heat processing chamber shown in FIG. 14 will be explained.

Figure 15:
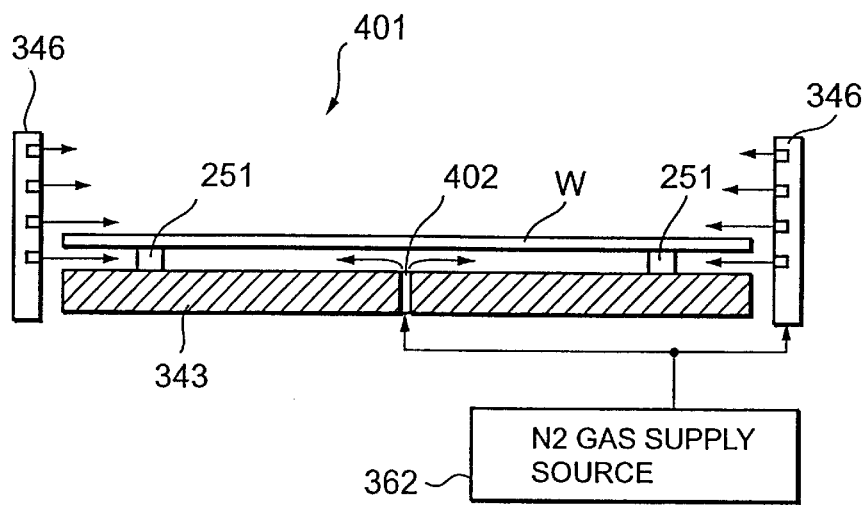
FIG. 15 is a sectional view showing another embodiment of the heat processing chamber.

A heat processing chamber 401 which FIG. 15 shows is provided with a jet port 402 for jetting $N_2$ gas to the front face of the hot plate 343. The provision of the jet port 402 makes it possible to supply $N_2$ gas to the gap between the rear face of the wafer W mounted on the hot plate 343 with the proximity sheets and the proximity pin between them and the hot plate 343 more efficiently and more uniformly.

Figure 16:
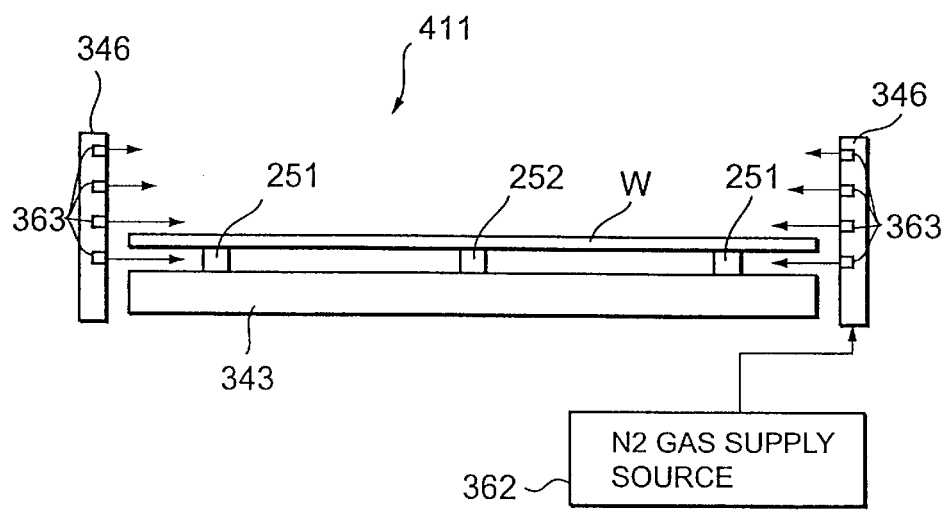
FIG. 16 is a sectional view showing still another embodiment of the heat processing chamber.

In a heat processing chamber 411 which FIG. 16 shows, the jet amount of $N_2$ gas jetted from the jet ports 363 provided at positions lower than the position of the rear face of the wafer W placed on the hot plate 343 with the proximity sheets and the proximity pin between them and the jet amount of $N_2$ gas jetted from the jet port 363 provided at a position closest to the front face of the wafer W are set to be maximum, and the jet amount of $N_2$ gas jetted from the jet port 363 is gradually decreased as the position of the jet port 363 is further away from the front face of the wafer W. It is insignificant that oxygen concentration is high to some extent at positions away from the wafer W, and hence consumption of $N_2$ gas can be reduced without exerting a bad influence on the wafer W by decreasing the supply amount of $N_2$ gas at positions away from the wafer W as in this example.

Figure 17:
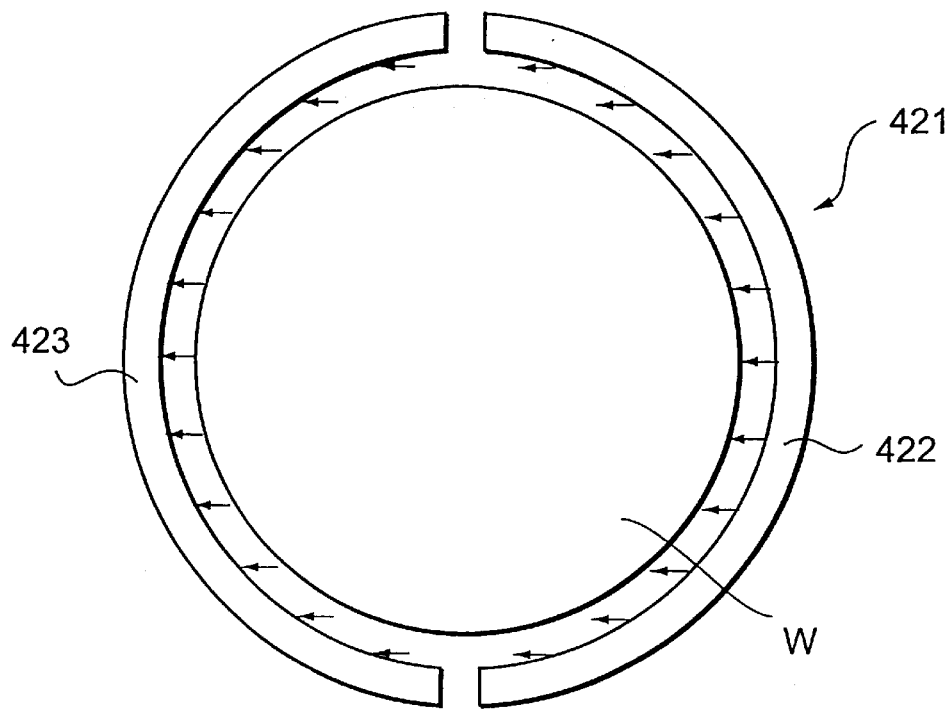
FIG. 17 is a plan view showing yet another embodiment of the heat processing chamber.
Figure 18:
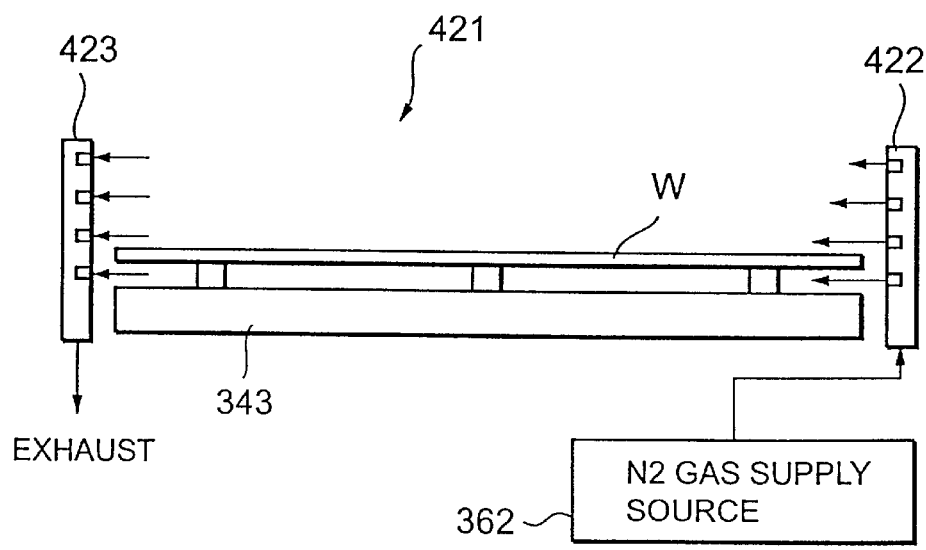
FIG. 18 is a sectional view of the heat processing chamber shown in FIG. 17.

A heat processing chamber 421 which FIG. 17 and FIG. 18 show is provided with an $N_2$ gas supply section 422 for supplying $N_2$ gas on one side of the hot plate 343 and an exhaust section 423 for performing exhaust on the other side of the hot plate 343.

Figure 19:
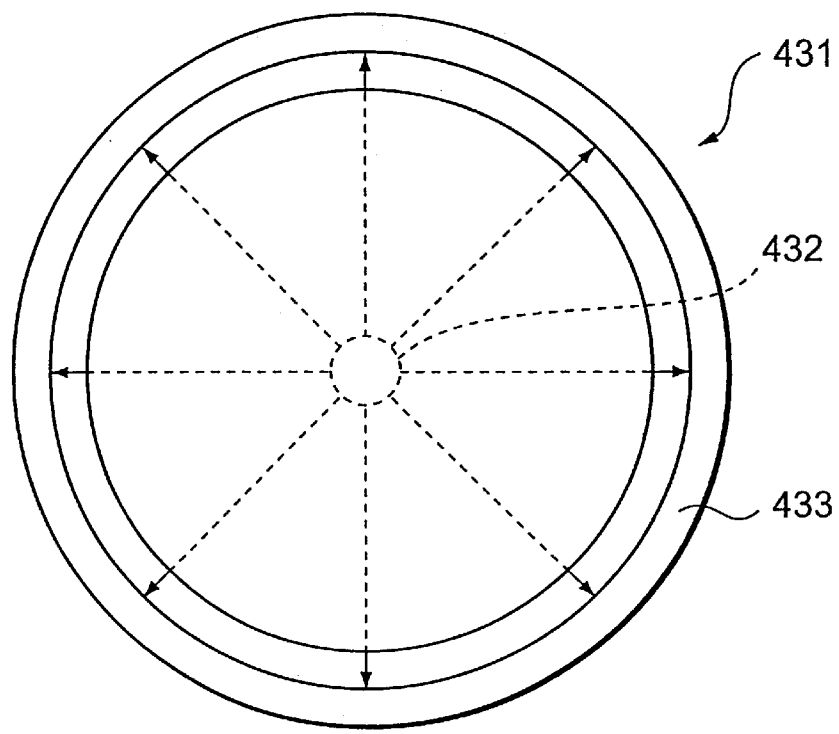
FIG. 19 is a plan view showing another embodiment of the heat processing chamber.
Figure 20:
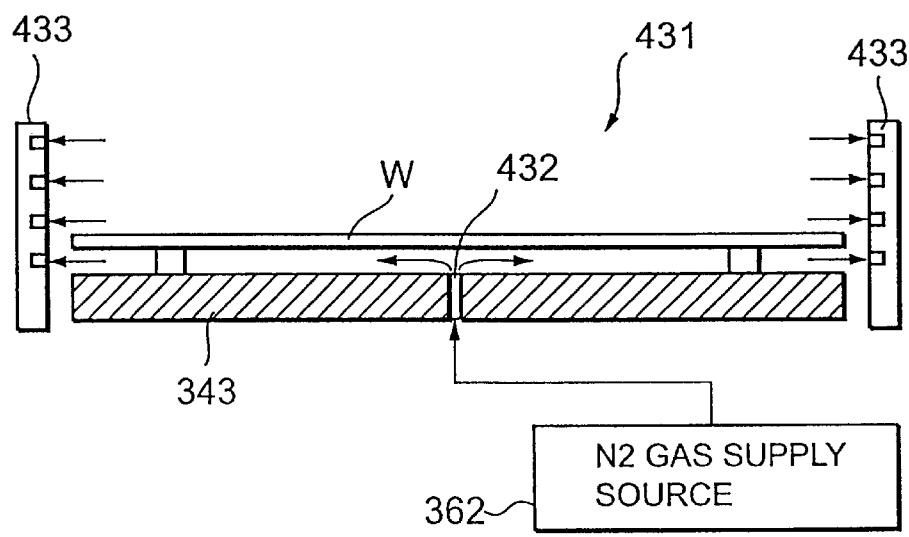
FIG. 20 is a sectional view of the heat processing chamber shown in FIG. 19.

A heat processing chamber 431 which FIG. 19 and FIG. 20 show is provided with an $N_2$ gas supply section 432 for supplying $N_2$ gas at the front face of the hot plate 343 and an exhaust section 433 for performing exhaust at the outer periphery of the hot plate 343.

In these heat processing chambers 421 and 431 structured as above, purge of $N_2$ gas can be performed more smoothly and more promptly.

Figure 21:
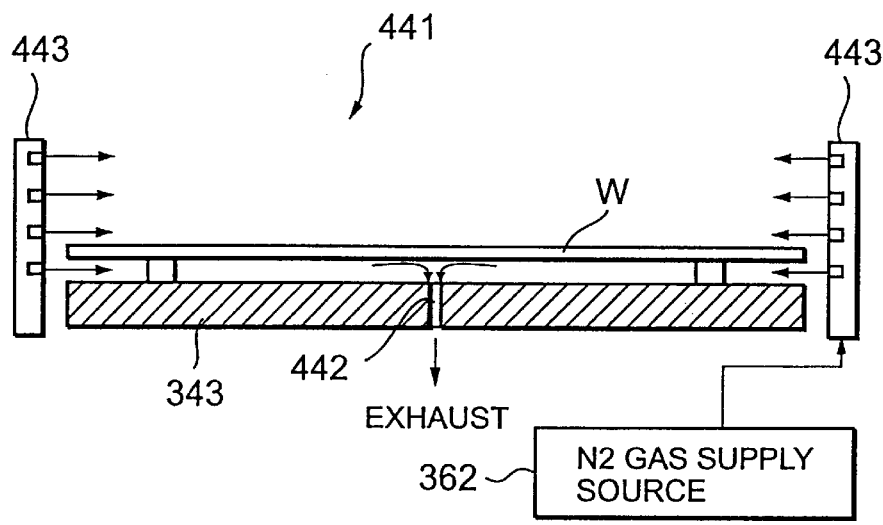
FIG. 21 is a plan view showing still another embodiment of the heat processing chamber.

A heat processing chamber 441 which FIG. 21 shows is provided with an exhaust section 442 for performing exhaust at the front face of the hot plate 343 and an $N_2$ gas supply section 443 for supplying $N_2$ gas at the outer periphery of the hot plate 343. In this example, specially by providing the exhaust section 442 at the front face of the hot plate 343, uniform exhaust can be attained, thus enabling uniform processing by uniform purge.

It is possible to embody the present invention with the following modifications.

Figure 22:
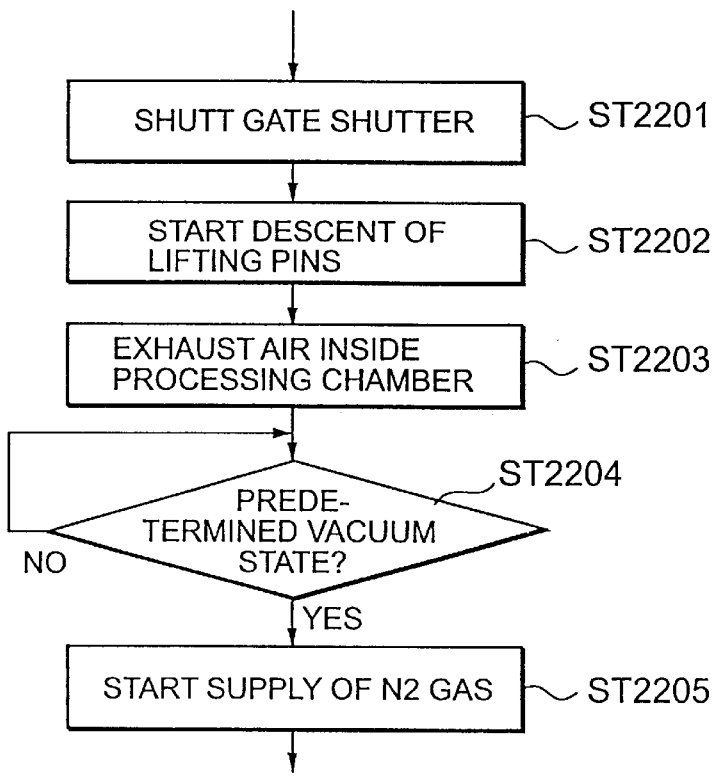
FIG. 22 is a flowchart showing another processing procedure in the heat processing chamber.

Specifically, as shown in FIG. 22, when the wafer W is transferred onto the lifting pins 347 from the main wafer transfer mechanism 22 while the lifting pins 347 are raised in the heat processing chamber 341 shown in FIG. 14, for example, the first and second gate shutters 344 and 345 are first shut (step 2201). Subsequently, the descent of the lifting pins 347 starts (step 2202), and then air inside the heat processing chamber 341 is exhausted without $N_2$ gas being supplied (step 2203). After a vacuum state to some extent is reached (after a lapse of a predetermined period of time) (step 2204), the exhaust of air is stopped and the supply of $N_2$ gas is started (step 2205). Thereafter, the wafer W is mounted on the hot plate 343 with the proximity sheets and the proximity pin between them. $N_2$ gas is supplied after a vacuum state is obtained temporarily in this embodiment, thereby enabling efficient purge.

Figure 23:
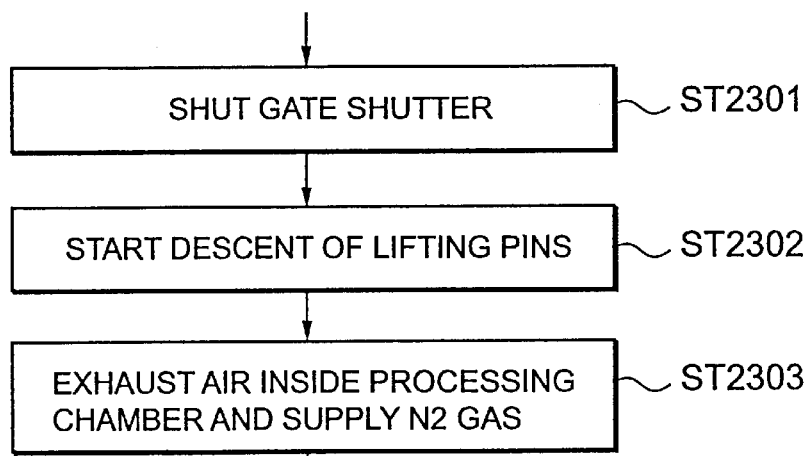
FIG. 23 is a flowchart showing still another processing procedure in the heat processing chamber.

Further, as shown in FIG. 23, when the wafer W is transferred onto the lifting pins 347 from the main wafer transfer mechanism 22 while the lifting pins 347 are raised in the heat processing chamber 341 shown in FIG. 14, for example, the first and second gate shutters 344 and 345 are first shut (step 2301). Subsequently, the descent of the lifting pins 347 starts (step 2302), and then $N_2$ gas is supplied while air inside the heat processing chamber 341 is exhausted (step 2303). Thereafter, the wafer W is mounted on the hot plate 343 with the proximity sheets and the proximity pin between them. Although there is a possibility that particles flutter when pressure is reduced specially since the inside of the processing chamber is temporarily in a vacuum state, the above situation can be avoided since there is no pressure reducing step in this embodiement. Moreover, the performance of exchange for $N_2$ gas in a laminar flow state can further improve temperature distribution, which enables heat processing at stable temperatures.

Figure 24:
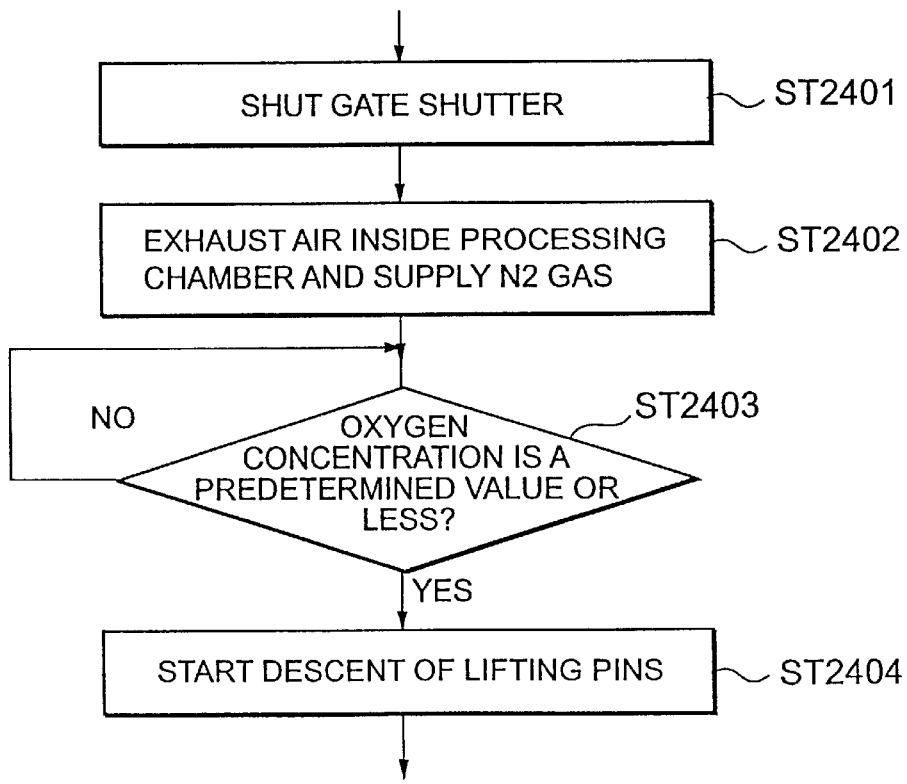
FIG. 24 is a flowchart showing yet another processing procedure in the heat processing chamber.

Further, as shown in FIG. 24, when the wafer W is transferred onto the lifting pins 347 from the main wafer transfer mechanism 22 while the lifting pins 347 are raised in the heat processing chamber 341 shown in FIG. 14, for example, the first and second gate shutters 344 and 345 are first shut (step 2401). Subsequently, $N_2$ gas is supplied while air inside the heat processing chamber 341 is exhausted (step 2402). Thereafter, oxygen concentration is confirmed and if the concentration reaches not more than a predetermined value (step 2403), the descent of the lifting pins 347 starts (step 2404). Then, the wafer W is mounted on the hot plate 343 with the proximity sheets and the proximity pin between them. In this embodiment, especially, heating of the wafer W is started after exchange for $N_2$ is completely finished, whereby oxidation of the wafer W can be surely prevented.

The present invention is not limited to the aforesaid embodiments and can be modified variously. For example, a substrate to be processed is not limited to a semiconductor wafer, and other substrates such as an LCD substrate and the like are also suitable. Moreover, the kind of a film is not limited to a layer insulating film.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:
    a plurality of kinds of processing stations each including a plate for performing heat processing or cooling processing for a substrate and a gap forming member for holding the substrate away from the plate; and
    a transfer device for transferring the substrate between the processing stations,
    wherein out of the plurality of kinds of processing stations, a processing station for performing heat processing for the substrate in an atmosphere the oxygen concentration of which is lowered includes a gap forming member with a height larger than heights of those of the other processing stations.

2. The apparatus as set forth in claim 1, further comprising:
    a supply section, disposed around the plate, for supplying gas for purge nearly parallel to the substrate placed on the plate with the gap forming member between them and toward a first face and a second face of the substrate.

3. The apparatus as set forth in claim 1, wherein the processing station for performing heat processing for the substrate in the atmosphere the oxygen concentration of which is lowered includes a gap forming member with a height which is nearly twice the heights of those of the other processing stations.

4. The apparatus as set forth in claim 1, wherein the processing station for performing heat processing for the substrate in the atmosphere the oxygen concentration of which is lowered includes a gap forming member with a height of nearly 0.1 mm to 0.2 mm.

5. A substrate processing apparatus, integrally comprising:

a coating processing station for coating a substrate with an insulating film material;

an aging processing station for performing aging processing for the substrate coated with the insulating film material;

a solvent exchange processing station for performing solvent exchange processing for the substrate subjected to the aging processing;

a low-temperature heat processing station for performing low-temperature heat processing for the substrate subjected to the solvent exchange processing;

a low-oxygen and high temperature heat processing station for performing high temperature heat processing in a low oxygen atmosphere for the substrate subjected to the low-temperature heat processing;

a low-oxygen curing and cooling processing station for performing curing and cooling processing in a low oxygen atmosphere for the substrate subjected to the low-oxygen and high-temperature heat processing; and a transfer device for transferring the substrate between these stations, wherein at least the aging processing station, the low-temperature heat processing station and the low-oxygen and high-temperature heat processing station each have a plate for performing heat processing for the substrate and a gap forming member for holding the substrate away from the plate, and wherein the height of the gap forming member of the low-oxygen and high temperature heat processing station or the low-oxygen curing and cooling processing station is higher than the heights of the gap forming members of the other processing stations.

6. The apparatus as set forth in claim 5, further integrally comprising:

a first cooling processing station for performing cooling processing for the substrate before coating the substrate with the insulating material; and a second cooling processing station for performing cooling processing for the substrate subjected to the low-oxygen curing and cooling processing, the first and second cooling processing stations each having a plate for performing heat processing or cooling processing for the substrate and a gap forming member for holding the substrate away from the plate.

* * * * *